US 11,947,265 B2

(12) United States Patent
Feldmann

(10) Patent No.: US 11,947,265 B2
(45) Date of Patent: Apr. 2, 2024

(54) OPTICAL DIFFRACTION COMPONENT

(71) Applicant: Carl Zeiss SMT GmbH, Oberkochen (DE)

(72) Inventor: Heiko Feldmann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/673,966

(22) Filed: Feb. 17, 2022

(65) Prior Publication Data

US 2022/0171292 A1 Jun. 2, 2022

Related U.S. Application Data

(63) Continuation of application No. PCT/EP2020/070424, filed on Jul. 20, 2020.

(30) Foreign Application Priority Data

Aug. 30, 2019 (DE) .......................... 102019213063.1

(51) Int. Cl.
*G03F 7/00* (2006.01)
*G02B 5/08* (2006.01)
*G02B 5/18* (2006.01)

(52) U.S. Cl.
CPC ....... *G03F 7/70158* (2013.01); *G02B 5/0891* (2013.01); *G02B 5/1838* (2013.01);
(Continued)

(58) Field of Classification Search
CPC .............. G02B 27/1086; G02B 27/425; G02B 5/0891; G02B 5/09; G02B 5/1838;
(Continued)

(56) References Cited

U.S. PATENT DOCUMENTS 5,162,943 A 11/1992 Komatsu et al.
8,451,429 B2 * 5/2013 Van Empel ......... G03F 7/70958
355/71
(Continued)

FOREIGN PATENT DOCUMENTS

DE 10 2009 045 096 A1 10/2010
DE 10 2009 044 462 A1 1/2011
(Continued)

OTHER PUBLICATIONS

German Examination Report, with translation thereof, for corresponding DE Appl No. 10 2019 213 063.1, dated Mar. 19, 2020.
(Continued)

*Primary Examiner* — Deoram Persaud
(74) *Attorney, Agent, or Firm* — Fish & Richardson P.C.

(57) ABSTRACT

An optical diffraction component has a periodic grating structure profile. The diffraction structure levels are arranged so that a wavelength range around two different target wavelengths diffracted by the grating structure profile has radiation components with three different phases that interfere destructively with one another. Diffraction structure levels predefine a topography of a grating period of the grating structure profile that is repeated regularly along a period running direction. These include a neutral diffraction structure level, a positive diffraction structure level raised relative thereto, and a negative diffraction structure level lowered relative thereto. The neutral diffraction structure level has an extent along the period running direction which is less than 50% of the extent of the grating period. A difference between the two target wavelengths is less than 50%. The result is an optical diffraction component whose possibilities for use can be extended, for example, to stray light suppression.

20 Claims, 7 Drawing Sheets

(52) U.S. Cl.
CPC ...... *G03F 7/70175* (2013.01); *G03F 7/70191* (2013.01); *G03F 7/70575* (2013.01)

(58) Field of Classification Search
CPC ............... G02B 5/1861; G03F 7/70158; G03F 7/70175; G03F 7/70191; G03F 7/70575; G21K 1/062; G21K 2201/067; H05G 2/008
See application file for complete search history.

(56) References Cited

U.S. PATENT DOCUMENTS

| | | | |
|---|---|---|---|
| 9,551,941 | B2 | 1/2017 | Ruoff et al. |
| 9,612,370 | B1* | 4/2017 | Johnson ................. G02B 5/122 |
| 10,241,421 | B2* | 3/2019 | Roos ....................... G21K 1/062 |
| 11,409,027 | B2* | 8/2022 | Morita ................ G03F 7/70575 |
| 2009/0289205 | A1 | 11/2009 | Moriya et al. |
| 2014/0085619 | A1* | 3/2014 | Banine .................. B82Y 10/00 355/71 |
| 2014/0131586 | A1 | 5/2014 | Wang et al. |
| 2015/0323872 | A1* | 11/2015 | Van De Kerkhof ......................... G03F 7/70266 355/71 |
| 2017/0254995 | A1* | 9/2017 | Bauer ................. G02B 19/0023 |
| 2018/0246414 | A1* | 8/2018 | Banine ................. G02B 5/1861 |
| 2020/0225586 | A1* | 7/2020 | Feldmann ........... G03F 7/70175 |

FOREIGN PATENT DOCUMENTS

| | | |
|---|---|---|
| DE | 10 2012 202 675 A1 | 1/2013 |
| DE | 10 2018 218 981 A1 | 12/2018 |
| EP | 1 540 423 B1 | 3/2007 |
| WO | WO 96/13942 A1 | 5/1996 |
| WO | WO 2014/114405 A2 | 7/2014 |
| WO | WO 2017/207401 A1 | 12/2017 |

OTHER PUBLICATIONS

Translation of International Search Report fort corresponding PCT/EP2020/070424, dated Oct. 9, 2020.

Kettunen, Ville et al. "Diffractive elements designed to suppress unwanted zeroth order due to surface depth error", Journal of Modern Optics, London / GB, vol. 51, No. 14, Sep. 20, 2004.

Fiegl, T. et al. "Multilayer EUV optics with integrated IR-suppression gratings", 2016 EUVL Workshop, Berkeley, Jun. 13-16, 2016.

Fiegl, Thorsten et al. "Sub-aperture EUV collector with dual-wavelength spectral purity filter", Proceedings of SPIE, IEEE, US, vol. 9422, Mar. 16, 2015.

Oliva, M. et al. "Multilevel blazed gratings in resonance domain: an alternative to the classical fabrication approach", Optics Express, vol. 19, No. 15, 2011.

Oliva, M. et al. "Highly efficient three-level blazed grating in the resonance domain", Optics Letters, vol. 35, No. 16, 2010.

* cited by examiner

OPTICAL DIFFRACTION COMPONENT

CROSS-REFERENCE TO RELATED APPLICATIONS

The present application is a continuation of, and claims benefit under 35 USC 120 to, international application PCT/EP2020/070424, filed Jul. 20, 2020, which claims benefit under 35 USC 119 of German Application No. 10 2019 213 063.1, filed Aug. 30, 2019. The entire disclosure of these applications are incorporated by reference herein.

FIELD

The disclosure relates to an optical diffraction component. Furthermore, the disclosure relates to an EUV collector of a projection exposure apparatus including such an optical diffraction component, an illumination system including such an EUV collector, an optical system including such an illumination system, a projection exposure apparatus including such an optical system, a method for producing a structured component with the aid of such a projection exposure apparatus, and a structured component produced in this way.

BACKGROUND

An EUV collector including an optical diffraction component in the form of an optical grating is known from WO 2017/207401 A1 and from WO 2014/114405 A2. Embodiments of optical gratings for suppressing IR wavelengths in EUV projection exposure apparatuses are known from the publication "Multilayer EUV optics with integrated IR-suppression gratings", T. Feigl et al., 2016 EUVL Workshop, Berkeley, Jun. 13-16, 2016. EP 1 540 423 B1 describes a grating-based spectral filter for suppressing radiation outside a used band in an EUV lithography system. US 2014/0131586 A1 describes a phase grating for a mask inspection system. DE 10 2009 044 462 A1 describes an optical filter element including a grating structure for diffracting infrared radiation within an EUV illumination system. The technical article "Multilevel blazed gratings in resonance domain: an alternative to the classical fabrication approach" by M. Oliva et al., OPTICS EXPRESS, Vol. 19, No. 15, 2011, pages 1473 to 1475, and the technical article "Highly efficient three-level blazed grating in the resonance domain" by M. Oliva et al., OPTICS LETTERS Vol. 35, No. 16, 2010, pages 2774 to 2776, describe different variants of blazed gratings. The technical article "Diffractive elements designed to suppress unwanted zeroth order due to surface depth error" by V. Kettunen et al., Journal of Modern Optics 51, 14, 2111-2123, 2004, discloses diffractive elements for suppressing unwanted zero orders of diffraction on account of a profile depth error. U.S. Pat. No. 9,551,941 B2 discloses an illumination system for an EUV lithography apparatus and a facet mirror therefor. WO 96/13942 A1 discloses an illumination system for display panels. U.S. Pat. No. 5,162,943 discloses an image reading apparatus with a diffraction grating. US 2009/0289205 A1 discloses a mirror for an EUV production method in the form of an EUV collector mirror. DE 10 2018 218 981 A1 discloses an optical grating for an EUV collector of a projection exposure apparatus.

SUMMARY

An optical grating can be used to suppress stray light of a wavelength that deviates from that of used light. The stray light can be diffracted by the optical grating toward a light trap (beam dump), while the used light takes a different path.

The present disclosure seeks to provide an optical diffraction component that can be used, for example, to suppress stray light.

In an aspect, the disclosure provides an optical diffraction component with a periodic grating structure profile with diffraction structures having exactly three diffraction structure levels predefining different structure depths relative to a reference plane. The arrangement of the diffraction structures is such that a wavelength range around two different target wavelengths diffracted by the grating structure profile has radiation components with three different phases that interfere destructively with one another. The diffraction structure levels predefine a topography of a grating period of the grating structure profile that is repeated regularly along a period running direction. The three diffraction structure levels include: a neutral diffraction structure level, which corresponds to a structure depth of 0; a positive diffraction structure level, which is raised relative to the neutral diffraction structure level; and a negative diffraction structure level, which is lowered relative to the neutral diffraction structure level. The grating period of the neutral diffraction structure level has an extent along the period running direction which is less than 50% of the extent of the grating period. A difference between the two target wavelengths is less than 50%.

It has been recognized according to the disclosure that in the case of a three-level structure an extent ratio between an extent of a neutral diffraction structure level and a total extent of a grating period is a degree of freedom that can be used in a targeted manner to achieve a suppression of different target wavelengths with predefined suppression requirements. In this case, comparatively small adaptations in comparison with arrangements of diffraction structure levels in which a neutral diffraction structure level within a grating period has exactly 50% of the extent of the grating period can surprisingly result in the possibility of suppressing different target wavelengths with wavelengths that differ to a comparatively small degree.

In general, to satisfy the condition of destructive interference of the three radiation components with different phases, the structure depth by which the positive diffraction structure level is raised relative to the neutral diffraction structure level or respectively by which the negative diffraction structure level is lowered relative to the neutral diffraction structure level can be in the region of one quarter of the averaged target wavelength. Depending on the two target wavelengths, the extents of the diffraction structure levels and the structure depth can be chosen so as to result in a suppression for the three different phases in the case of both wavelengths. An extent of the neutral diffraction structure level within the grating period can be less than 49.95% (e.g., less than 49%, less than 45%, less than 40%, less than 35%, less than 30%, less than 25%, less than 20%, less than 15%) of the extent of the grating period. The extent of the neutral diffraction structure level within the grating period can be greater than 5% of the extent of the grating period.

In some embodiments, the difference between the two target wavelengths that differ to a comparatively small degree is less than 50%. In such embodiments, if the first, larger target wavelength is designated by $\lambda 1$ and the second, smaller target wavelength is designated by $\lambda 2$, it is thus the case that $\lambda 1 - \lambda 2$ is less than $0.5\, \lambda 1$.

In certain embodiments, an alternative difference criterion between the two target wavelengths $\lambda 1$ and $\lambda 2$ that differ to a comparatively small degree is implemented. In such embodiments, the criterion be complied with by the optical diffraction component according to the disclosure, which can replace the above-discussed criterion "difference between the two target wavelengths of less than 50%", is given by $$(\lambda1-\lambda2)^2/(\lambda1+\lambda2)^2 < 20\%.$$

The following can hold true here: $(\lambda1-\lambda2)^2/(\lambda1+\lambda2)^2$ can be <15% (e.g., <12%, <10%, <8%, <5%, <4%, <3%, <2%, <1%).

In some embodiments, the optical diffraction component is configured to suppress two wavelengths that differ to a greater degree. In such embodiments, the difference between the two target wavelengths that differ to a greater degree can be greater than 50% (e.g., greater than 60%, greater than 70%, greater than 80%). It then holds true that $\lambda1-\lambda2$ is greater than 0.5 $\lambda1$.

The criterion with regard to the suppression of two wavelengths that differ to a greater degree, analogously to the above-discussed criterion "wavelengths that differ to a comparatively small degree", can also be expressed as follows:

$$(\lambda1-\lambda2)^2/(\lambda1+\lambda2)^2 > 20\%.$$

This difference $(\lambda1-\lambda2)^2/(\lambda1+\lambda2)^2$ can be even greater and can be greater than 30% (e.g., greater than 50%, greater than 80%).

The optical diffraction component can also be designed for suppressing three different target wavelengths, two different target wavelengths of which satisfy one of the above criteria "comparatively small difference" or "greater difference". Alternatively, it is possible for two of the three target wavelengths to be suppressed to satisfy one criterion "comparatively small difference" and for two other target wavelengths from among the three target wavelengths to be suppressed to satisfy the other criterion "greater difference".

The two target wavelengths or two of the three target wavelengths can be for example 10.2 µm and 10.6 µm and/or 10.6 µm and 1.046 µm.

In some embodiments, the positive diffraction structure level and the negative diffraction structure level have the same extent along the period running direction. Such embodiments can lead to a good suppression result for both target wavelengths.

In some embodiments, the positive diffraction structure level and the negative diffraction structure level have the same absolute structure depth relative to the reference plane. Such embodiments can lead to a good suppression result for both target wavelengths.

In some embodiments, the two target wavelengths differ by at least 1%. In such embodiments, radiations with two different target wavelengths can be jointly suppressed by the optical diffraction component. The difference between the two target wavelengths can be greater than 5% (e.g., greater than 10%, greater than 15%, greater than 20%, greater than 25%, greater than 30%, greater than 35%, greater than 40%, greater than 45%). The difference between the two target wavelengths can be less than 50%, such as less than 10%. The two target wavelengths can be for example within a wavelength band between 1 µm and 10.1 µm.

In some embodiments, the grating period has an extent in the range of between 0.5 mm and 5 mm along the period running direction. Such embodiments can simplify production of the optical diffraction component.

In some embodiments, the optical diffraction component includes a sequence of the diffraction structure levels in the period running direction such that a mirror-symmetrical arrangement of the diffraction structure levels results. Such a mirror-symmetrical arrangement of the diffraction structure levels can simplify production of the optical diffraction component.

In an aspect, the disclosure provides an EUV collector for use in an EUV projection exposure apparatus, which includes an optical diffraction component according to the disclosure. Features of such an EUV collector can correspond to those of an optical diffraction component according to the disclosure. Such features can be provided, for example, in the case of use in association with an EUV light source in which plasma is produced by laser-induced discharge.

In some embodiments, the collector mirror is configured to guide EUV radiation toward a focal region, wherein the optical diffraction component is configured to guide the radiation of the at least one target wavelength away from the focal region. The radiation of the at least one target wavelength is also referred to as stray light.

In an aspect, the disclosure provides an illumination system that includes an EUV collector according to the disclosure and an illumination optical unit for illuminating an object field in which an object to be imaged is arrangeable. Features of such an illumination system can correspond to those of an EUV collector according to the disclosure. Generally, the EUV used light is precisely not suppressed by the optical diffraction component, that is to say has a different wavelength than stray light to be suppressed.

The illumination system can be fashioned with the optical diffraction component embodied as described above so as to result in a homogeneous distribution of the stray light in the region of stray light removal locations and for example in the region of beam dumps provided for this purpose. Alternatively or additionally, it is possible to ensure a predefined distribution function of the used light for example in specific sections of an illumination beam path of the illumination system, for example in the region of a pupil plane.

In aspects, the disclosure provides a related optical system, a related projection exposure apparatus, a related method of using such a projection exposure apparatus to produce a structured component, and a related structured component. Features of such aspects can correspond to those described above for an optical component according to the disclosure.

In some embodiments, a semiconductor component, for example a memory chip or a chip for processing data, can be produced using the projection exposure apparatus.

BRIEF DESCRIPTION OF THE DRAWINGS

Exemplary embodiments of the disclosure are explained in greater detail below with reference to the drawing, in which.

DESCRIPTION OF EXEMPLARY EMBODIMENTS

Figure 1:
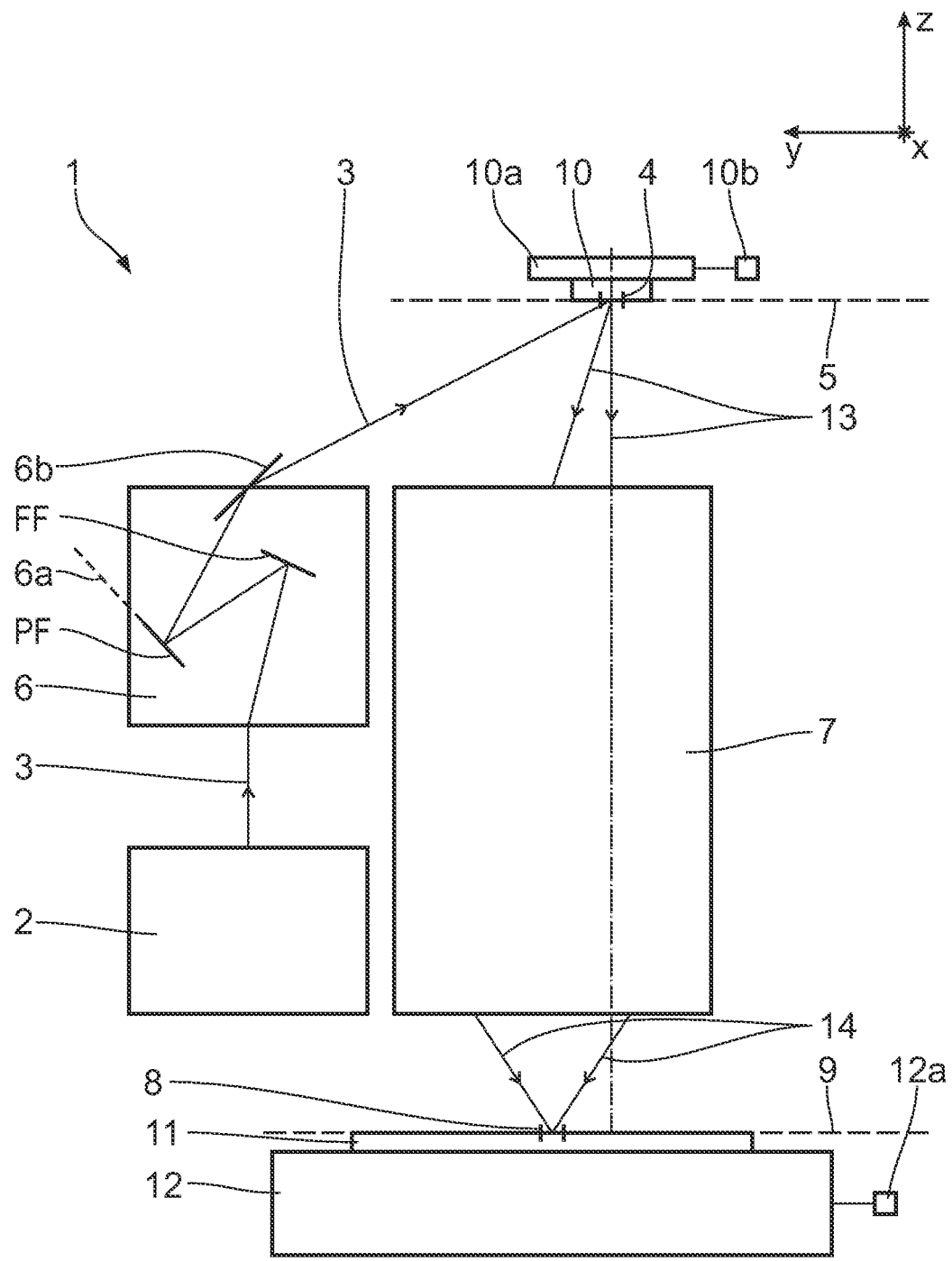
FIG. 1 schematically shows a projection exposure apparatus for EUV microlithography.

A projection exposure apparatus 1 for microlithography includes a light source 2 for illumination light or imaging light 3, which will be explained in yet more detail below. The light source 2 is an EUV light source, which produces light in a wavelength range of, for example, between 5 nm and 30 nm, such as between 5 nm and 15 nm. The illumination light or imaging light 3 is also referred to as EUV used light below.

For example, the light source 2 can be a light source with a wavelength of 13.5 nm or a light source with a wavelength of 6.9 nm. Other EUV wavelengths are also possible. A beam path of the illumination light 3 is illustrated very schematically in FIG. 1.

An illumination optical unit 6 is used to guide the illumination light 3 from the light source 2 to an object field 4 in an object plane 5. The illumination optical unit includes a field facet mirror FF illustrated highly schematically in FIG. 1 and a pupil facet mirror PF disposed downstream in the beam path of the illumination light 3 and likewise illustrated highly schematically. A field-forming mirror 6b for grazing incidence (GI mirror; grazing incidence mirror) is arranged in the beam path of the illumination light 3 between the pupil facet mirror PF, which is arranged in a pupil plane 6a of the illumination optical unit, and the object field 4. Such a GI mirror 6b is not mandatory.

Pupil facets (not illustrated in any more detail) of the pupil facet mirror PF are part of a transfer optical unit, which transfer, and for example image, field facets (likewise not illustrated) of the field facet mirror FF into the object field 4 in a manner being superimposed on one another. An embodiment known from the prior art can be used for the field facet mirror FF on the one hand and the pupil facet mirror PF on the other hand. By way of example, such an illumination optical unit is known from DE 10 2009 045 096 A1.

Using a projection optical unit or imaging optical unit 7, the object field 4 is imaged into an image field 8 in an image plane 9 with a predefined reduction scale. Projection optical units which can be used for this purpose are known from e.g. DE 10 2012 202 675 A1.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the left in FIG. 1 and the z-direction runs upwards in FIG. 1. The object plane 5 runs parallel to the xy-plane.

The object field 4 and the image field 8 are rectangular. Alternatively, it is also possible for the object field 4 and the image field 8 to have a bent or curved embodiment, that is to say, for example, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

One of the exemplary embodiments known from the prior art can be used for the projection optical unit 7. What is imaged in this case is a portion of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a beam 13 of the illumination light 3 that enters into the projection optical unit and, between the projection optical unit 7 and the substrate 11, a beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously with one another by an appropriate actuation of the displacement drives 10b and 12a.

Figure 2:
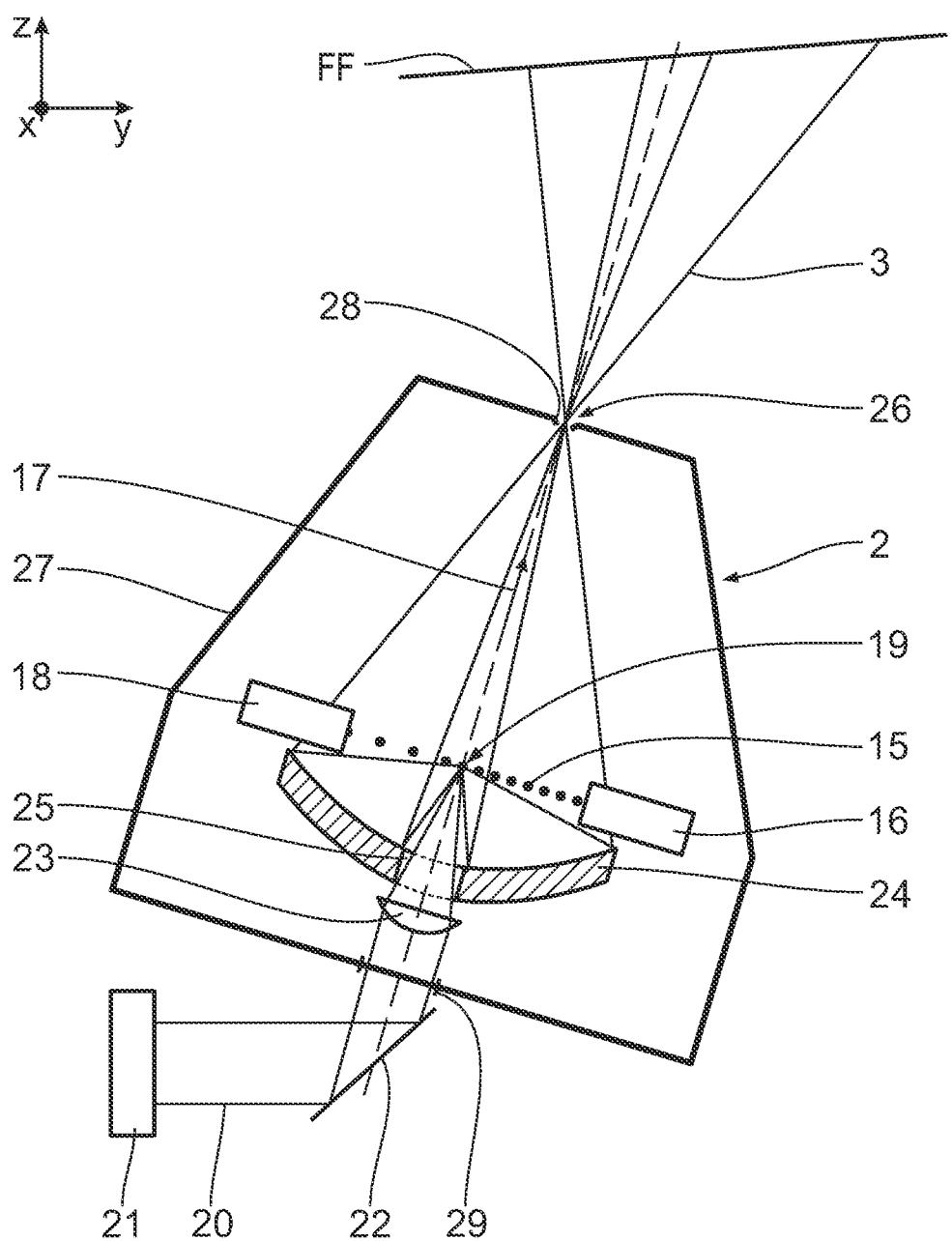
FIG. 2 shows details of a light source of the projection exposure apparatus in the environment of an EUV collector for guiding EUV used light from a plasma source region to a field facet mirror of an illumination optical unit of the projection exposure apparatus, with the EUV collector being illustrated in a meridional section.

FIG. 2 shows details of the light source 2.

The light source 2 is an LPP (laser produced plasma) source. For the purposes of producing plasma, tin droplets 15 are generated as a continuous droplet sequence by a tin droplet generator 16. A trajectory of the tin droplets 15 extends transversely to a principal ray direction 17 of the EUV used light 3. Here, the tin droplets 15 drop freely between the tin droplet generator 16 and a tin capturing device 18, with the droplets passing through a plasma source region 19. The EUV used light 3 is emitted by the plasma source region 19. When the tin droplet 15 arrives in the plasma source region 19, it is impinged upon there by pump light 20 from a pump light source 21. The pump light source 21 can be an infrared laser source in the form of e.g. a $CO_2$ laser. A different IR laser source is also possible, for example a solid-state laser, for example an Nd:YAG laser. The pump light source 21 can include a light source unit for producing a light prepulse and a light source unit for producing a main light pulse. The light prepulse, on the one hand, and the main light pulse, on the other hand, can have different light wavelengths.

The pump light 20 is transferred into the plasma source region 19 by way of a mirror 22, which can be a mirror that is tiltable in a controlled fashion, and by way of a focusing lens element 23. A plasma emitting the EUV used light 3 is produced by the pump light impingement from the tin droplet 15 arriving in the plasma source region 19. A beam path of the EUV used light 3 is illustrated in FIG. 2 between the plasma source region 19 and the field facet mirror FF, to the extent that the EUV used light is reflected by a collector mirror 24, which is also referred to as EUV collector 24 below. The EUV collector 24 includes a central passage opening 25 for the pump light 20 focused toward the plasma source region 19 by way of the focusing lens element 23. The collector 24 is embodied as an ellipsoid mirror and transfers the EUV used light 3 emitted by the plasma source region 19, which is arranged at one ellipsoid focus, to an intermediate focus 26 of the EUV used light 3, which is arranged at the other ellipsoid focus of the collector 24.

The field facet mirror FF is disposed downstream of the intermediate focus 26 in the beam path of the EUV used light 3, in the region of a far field of the EUV used light 3.

The EUV collector 24 and further components of the light source 2, which may be the tin droplet generator 16, the tin capturing device 18 and the focusing lens element 23, are arranged in a vacuum housing 27. The vacuum housing 27 has a passage opening 28 in the region of the intermediate focus 26. In the region of an entrance of the pump light 20 into the vacuum housing 27, the latter includes a pump light entrance window 29 for the light prepulse and for the main light pulse.

Figure 3:
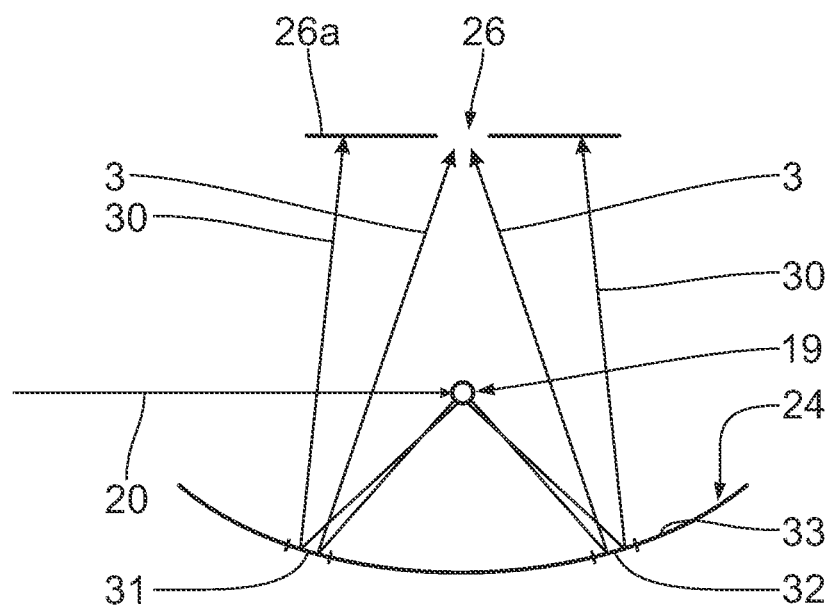
FIG. 3 shows, in a more abstract illustration in comparison with FIG. 3, guidance firstly of EUV used light and secondly of wavelength-different stray light components in the case of reflection/diffraction at the EUV collector.

FIG. 3 shows highly abstractly guidance firstly of EUV used light, that is to say the illumination light 3, and secondly of stray light 30, for example of radiation of longer wavelength, for example IR radiation having the wavelengths of the light prepulse and/or of the main light pulse, between the plasma source region 19 of the light source 2 and an intermediate focal plane 26a, in which the intermediate focus 26 is arranged. At the same time FIG. 3 shows a variant of lateral guidance of the pump light 20 to the plasma source region 19, that is to say guidance which does not require a passage opening of the type of the passage opening 25 in the EUV collector 24. Both the used light 3 and the stray light 30 emanate from the plasma source region 19. Both the used light 3 and the stray light 30 are incident on surface sections 31, 32 of an entire impingement surface 33 of the EUV collector 24. The surface sections 31, 32 are sections of a grating surface—likewise designated by 33 in the drawing—of the EUV collector 24, an optical grating for diffractively dumping the stray light radiation 30 being arranged on the grating surface. Embodiments of the optical grating are described below. The grating surface can be arranged exclusively at the location of the surface sections 31, 32 on which the stray light 30 impinges, or can alternatively also cover larger sections of the impingement surface 33, and cover the entire impingement surface 33 in a further variant.

Figure 4:
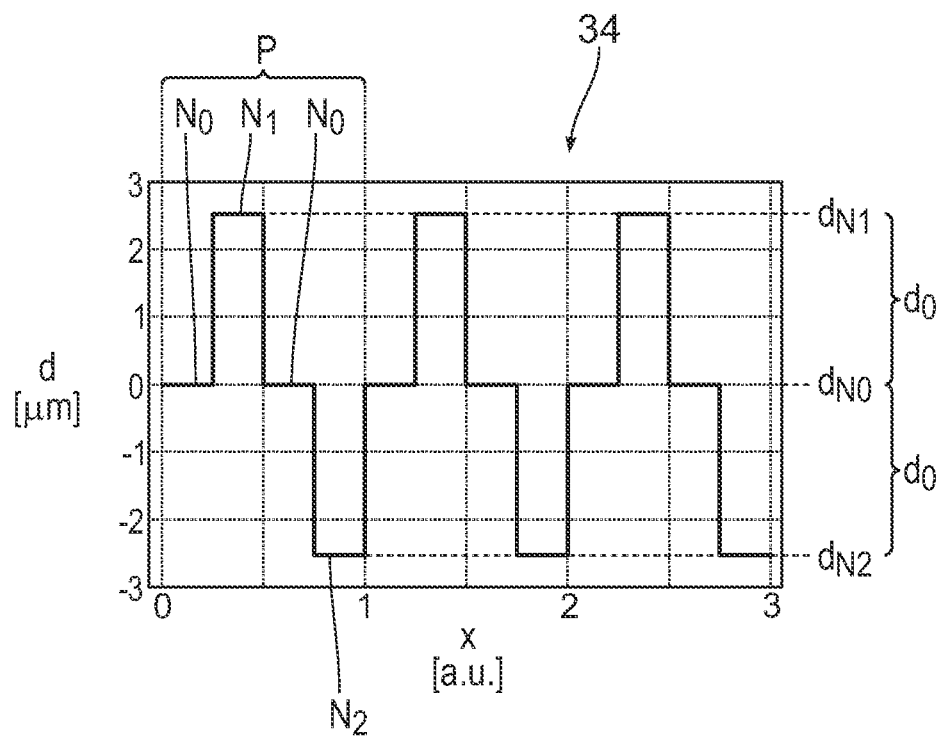
FIG. 4 shows, in a greatly enlarged illustration with regard to a structure depth, a side view of an optical diffraction component with a periodic grating structure profile with diffraction structures with exactly three diffraction structure levels, wherein within a grating period a neutral diffraction structure level has an extent along a period running direction which is less than 50% of the extent of the grating period along the period running direction.

FIG. 4 shows an embodiment of an optical diffraction component 34 for suppressing two different target wavelengths, namely the wavelengths of the light prepulse from the light source 2, on the one hand, and the main light pulse from the light source 2, on the other hand. The optical diffraction component 34 is embodied as an optical grating with a grating period P along a period running direction x. FIG. 4 illustrates a structure height d of the optical grating 34 plotted against the period running direction x. The structure depth d is illustrated with a greatly enlarged scaling in comparison with the period running direction x. A typical order of magnitude for the structure depth d is a few micrometers. A typical order of magnitude for the period P lies in the millimeter range, for example in the range between 0.5 and 10 mm, for example in the range between 1 mm and 4 mm.

Structure depth values d are indicated below with computed accuracy in some instances, where it is regularly sufficient for the structure depth when indicated in micrometers to be rounded to two places following the decimal point.

The grating structure profile of the optical diffraction component 34 has diffraction structures with exactly three diffraction structure levels, which are designated by $N_0$, $N_1$ and $N_2$ in FIG. 4. The diffraction structure levels $N_0$ to $N_2$ predefine different structure depths $d_{Ni}$ relative to a reference plane (d=0). The diffraction structure level $N_1$ is a positive diffraction structure level with a structure depth (structure height) $d_{N1}=d_0$ of 2.59904 μm (or 2.60 μm). The diffraction structure level $N_0$ is embodied as a neutral diffraction structure level with a structure depth $d_{N0}$ of 0. The diffraction structure level No is thus at the level of the reference plane. The diffraction structure level $N_2$ is embodied as a negative diffraction structure level and is lowered relative to the neutral diffraction structure level No by a structure depth $d_{N2}=-d_0$ of, in absolute terms, 2.59904 μm. For the structure depth of the negative diffraction structure level $N_2$, it thus holds true that: $d_{N2}=-2.59904$ μm.

The diffraction structures of the optical grating 34 are arranged such that a wavelength range around the two target wavelengths λ1, e.g. the light prepulse, and λ2, e.g. the main light pulse, which are diffracted by the grating structure profile has radiation components with three different phases that interfere destructively with one another.

The diffraction structure levels $N_0$ to $N_2$ predefine a topography of a grating period of the grating structure profile that is repeated regularly along the period running direction x.

The illustrated embodiment according to FIG. 4 exhibits the following sequence of the different diffraction structure levels $N_i$ within the grating period: $N_0$, $N_1$, $N_0$, $N_2$. A cyclic interchange or mirroring of this sequence is also possible.

Within the grating period P, the neutral diffraction structure level No has a total extent $a_0$ along the period running direction x which is less than 50% of the extent of the entire grating period P. A sum of the extents $a_1$, $a_2$ of the positive diffraction structure level $N_1$ and of the negative diffraction structure level $N_2$ is thus greater than the total extent of the neutral diffraction structure level $N_0$.

The optical grating 34 is illustrated with ideally steep sidewalls between the different diffraction structure levels $N_i$ in FIG. 4.

A displacement of the diffraction structure levels $N_i$ that maintains the respective extent $a_0$, $a_1$, $a_2$ of the different diffraction structure levels $N_i$ within the grating period P is also possible. In this regard, for example, unlike in the symmetrical arrangement illustrated in FIG. 4, the positive diffraction structure level $N_1$ can be arranged asymmetrically between two neutral diffraction structure levels $N_0$ extended equally far along the period running direction x, such that the neutral diffraction structure levels upstream and downstream of the positive diffraction structure level $N_1$ in the period running direction x have a mutually different extent along the period running direction. It is also possible to provide exactly one neutral diffraction structure level $N_0$ instead of two neutral diffraction structure levels No separated from one another within the grating period P, the extent $a_0$ of the exactly one neutral diffraction structure level along the period running direction x then being less than 50% of the x-extent of the grating period P.

Basic properties of the optical diffraction component 34 are tabulated below:

|  | Optical grating 34 (FIG. 4) |
|---|---|
| a0 | 49.9543% |
| a1(=a2) | 25.0228% |
| $d_0$ | 2.59904 µm |
| λ1 | 10.2 µm |
| λ2 | 10.6 µm |

In this case, a0 denotes the ratio between the total extent of the neutral diffraction structure levels $N_0$ in a grating period P and the extent of the grating period P.

a1(=a2) denote the ratio proportions of the extents of the positive diffraction structure level $N_1$ and of the negative diffraction structure level $N_2$ within the grating period P relative to the total extent of the grating period P. The extents a1, a2 of the positive diffraction structure level N1, on the one hand, and of the negative diffraction structure level N2, on the other hand, along the period running direction x are exactly equal.

$d_0$ denotes the absolute structure depth of the positive diffraction structure level $N_1$, on the one hand, and of the negative diffraction structure level $N_2$, on the other hand.

λ1, λ2 denote the two target wavelengths to be suppressed.

The extents $a_0$, $a_1$ and $a_2$ of the diffraction structure levels $N_0$, $N_1$, $N_2$ and also the structure depth do are chosen such that for both target wavelengths λ1 and λ2 upon addition of the three radiation components with different phases that are generated upon reflection at the grating structure profile on account of the diffraction structure levels $N_i$, in addition in each case destructive interference results. In an arrow diagram indicating real and imaginary parts of the radiation components, the three contributions add up to zero if the wavelength corresponds to one of the two target wavelengths.

The parameters $d_0$, $a_0$, $a_1$ and $a_2$ are designed such that the following equation is satisfied for both target wavelengths λ1 and λ2:

$$a_0 + a_1 e^{+i4\pi d_0/\lambda} + a_2 e^{-i4\pi d_0/\lambda} = 0$$

This equation applies to the case of normal incidence of the radiation on the grating. An adaptation of the parameters for non-normal incidence is obvious to a person skilled in the art. This adaptation can vary across the component.

Figure 5:
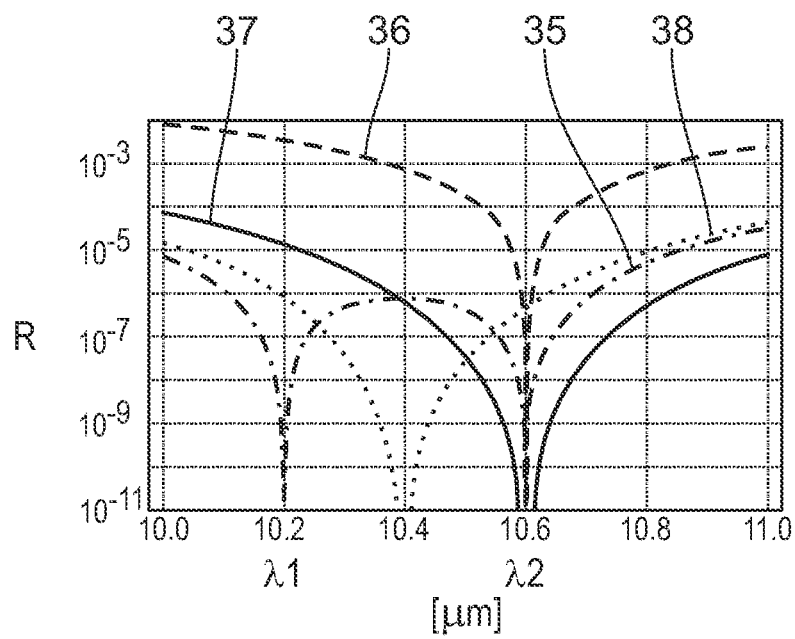
FIG. 5 shows, in a diagram, a wavelength-dependent reflectivity of the diffraction component according to FIG. 4 (dash-dotted) in comparison with other optical diffraction components, not according to the disclosure.

FIG. 5 shows, in a diagram, wavelength-dependent reflectivities R for various grating variants in the wavelength range of between 10.0 and 11.0 µm. A reflectivity 35 of the optical diffraction component 34 is illustrated by a dash-dotted line. A suppression of more than 10 orders of magnitude ($10^{-11}$) results for the two target wavelengths λ1 and λ2.

For comparison, FIG. 5 also illustrates reflectivities of further optical diffraction components, not according to the disclosure, specifically of a binary grating (reflectivity 36), i.e. of a grating with exactly two diffraction structure levels with identical extents within a grating period, a reflectivity 37 of an optical diffraction component with three diffraction structure levels, wherein there a neutral diffraction structure level has exactly 50% of the extent of the entire grating period with a structure depth of 2.65 µm, and a reflectivity 38 of a corresponding optical diffraction component with three diffraction structure levels, wherein once again the neutral diffraction structure level has exactly 50% of the extent of the entire grating period, with a structure depth d=2.60 µm.

The reflectivity 36 exhibits a narrowband suppression at the target wavelength λ2. The reflectivities 37 and 38 exhibit more broadband suppressions firstly at the target wavelength λ2 (reflectivity 37) and secondly at 10.4 µm (reflectivity 38).

FIGS. 6 to 9 show further embodiments of optical diffraction components.

Figure 6:
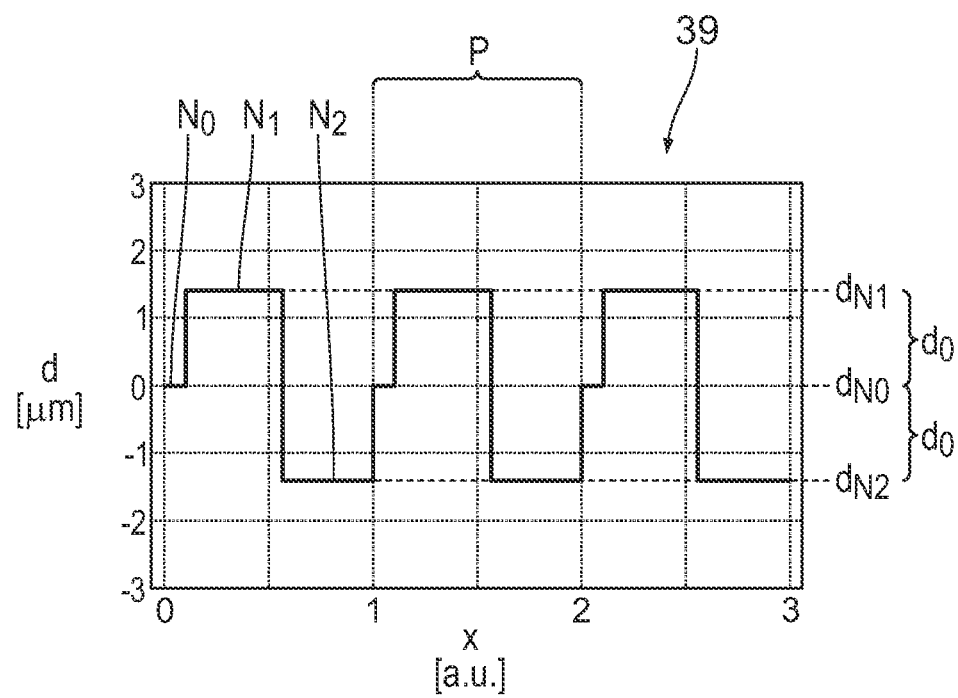
FIG. 6 shows, in an illustration similar to FIG. 4, a further embodiment of a optical diffraction component, once again with three diffraction structure levels, embodied for suppressing a first target wavelength in the region of 10 μm and a second target wavelength in the region of 1 μm, with a first, asymmetrical layout of the diffraction structure levels.
Figure 7:
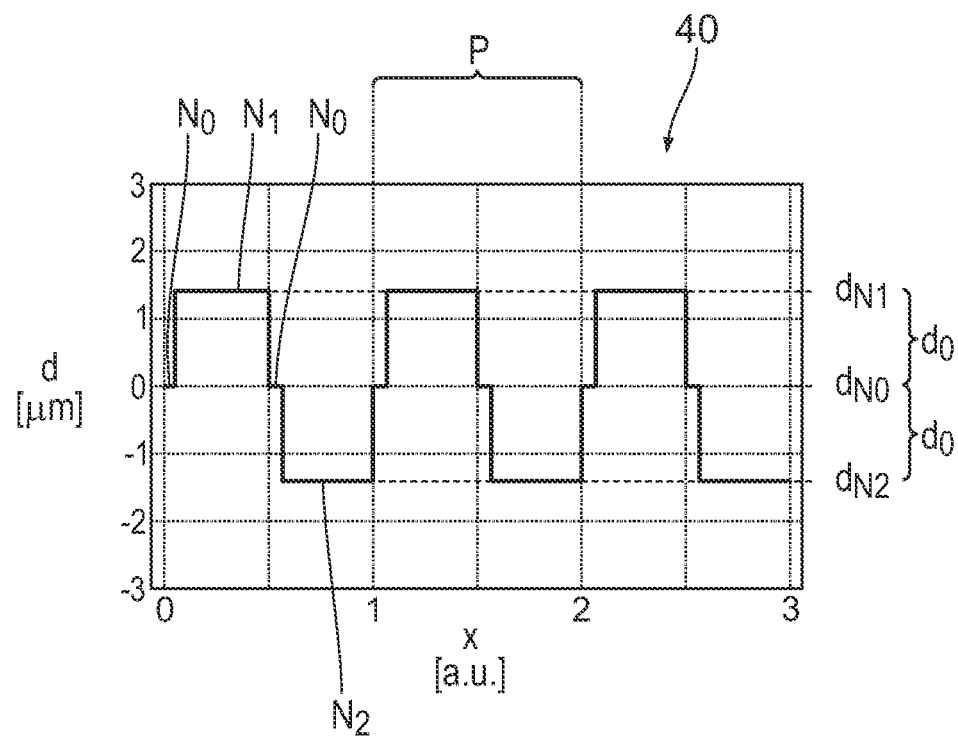
FIG. 7 shows, in an illustration similar to FIG. 4, an embodiment of the optical diffraction component which, apart from the fact that a symmetrical layout of the diffraction structure levels is present, corresponds to that according to FIG. 6.

In this case, FIGS. 6 and 7 show two embodiments of a first design of an extent distribution of the three diffraction structure levels of $N_0$, $N_1$, $N_2$, wherein the neutral diffraction structure level has a comparatively small total extent in comparison with the total extent of the grating period P.

In this case, FIG. 6 shows an optical diffraction component 39 with an asymmetrical design of the three diffraction structure levels $N_i$, wherein in the period running direction x the neutral diffraction structure level $N_0$ is followed by firstly the positive diffraction structure level $N_1$ and then the negative diffraction structure level $N_2$.

In the case of the design according to FIG. 6, therefore, exactly one neutral diffraction structure level $N_0$ is present within a grating period P.

In the case of the optical diffraction component 40 according to FIG. 7, in the grating period P the diffraction structure levels $N_i$ succeed one another as follows: $N_0$, $N_1$, $N_0$, $N_2$. In terms of the sequence, therefore, this corresponds to the embodiment of the optical diffraction component 34 according to FIG. 4.

In the case of the design according to FIG. 7, the positive diffraction structure level $N_1$ once again lies symmetrically between two neutral diffraction structure levels No with extents of equal length.

Figure 8:
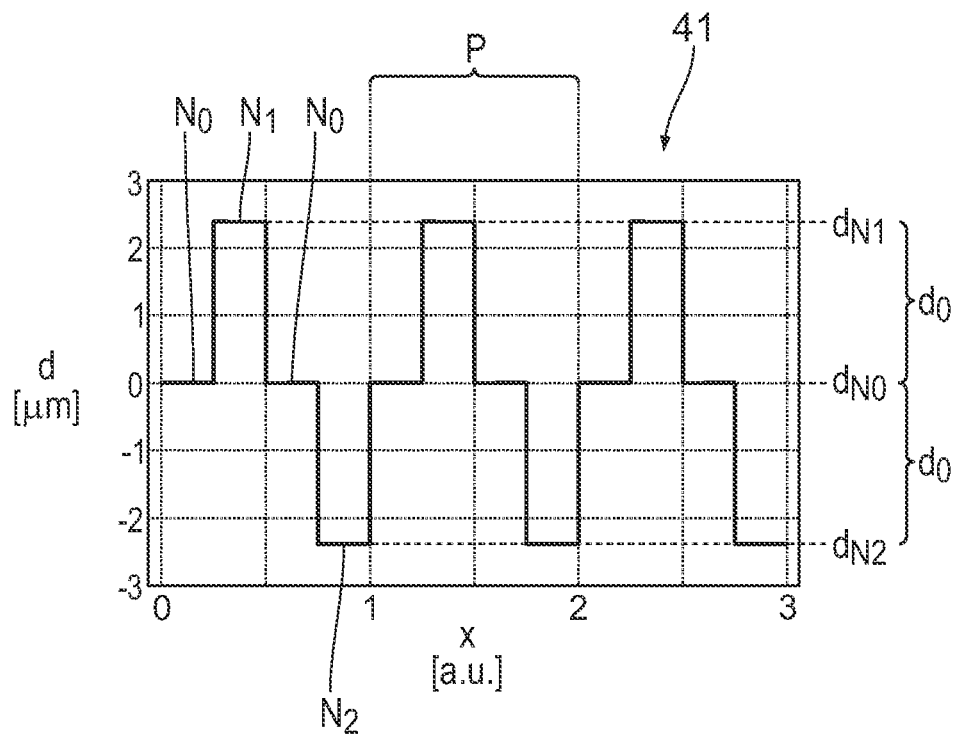
FIG. 8 shows, in an illustration similar to FIG. 4, a further embodiment of an optical diffraction component with three diffraction structure levels, once again designed for suppressing a first target wavelength in the region of 10 μm and a second target wavelength in the region of 1 μm.
Figure 9:
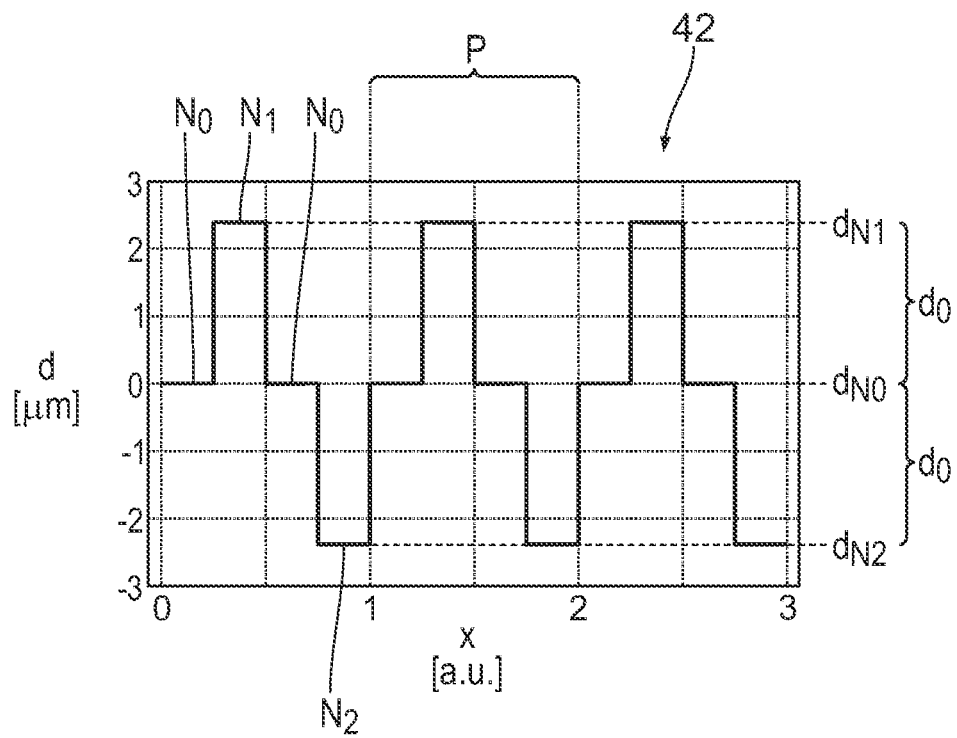
FIG. 9 shows, in an illustration similar to FIG. 4, a further embodiment of an optical diffraction component with three diffraction structure levels, once again designed for suppressing a first target wavelength in the region of 10 μm and a second target wavelength in the region of 1 μm.

Optical diffraction components 41, 42 according to FIGS. 8 and 9 differ from the optical diffraction component 34 according to FIG. 4 merely in parameter details.

In a manner corresponding to the above tabulation concerning the optical diffraction component 34, the basic parameters of the optical diffraction components 39 to 41 are tabulated below:

|   | Optical grating 39/40 (FIG. 6/7) | Optical grating 41 (FIG. 8) | Optical grating 42 (FIG. 9) |
|---|---|---|---|
| a0 | 10.8652% | 48.6984% | 48.0496% |
| a1 (=a2) | 44.5674% | 25.6508% | 25.9752% |
| $d_0$ | 1.42808 μm | 2.38013 μm | 2.32104 μm |

The optical gratings 39 to 42 according to FIGS. 6 to 9 are designed for suppression of two greatly different target wavelengths λ1, λ2, namely a first target wavelength λ1 in the region of 10.6 μm and a second target wavelength λ2 in the region of 1.046 μm.

Figure 10:
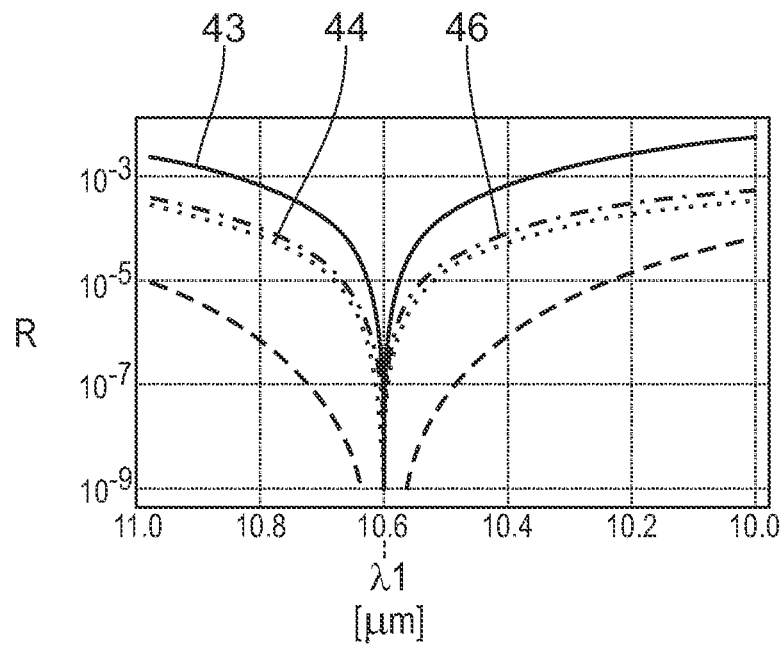
FIG. 10 shows, in an illustration similar to FIG. 5, a wavelength-dependent reflectivity R in the region of the first target wavelength for the optical diffraction components according to FIGS. 6 and 7 (solid), according to FIG. 8 (dotted) and according to FIG. 9 (dash-dotted) in comparison with an optical diffraction component not according to the disclosure (dashed)
Figure 11:
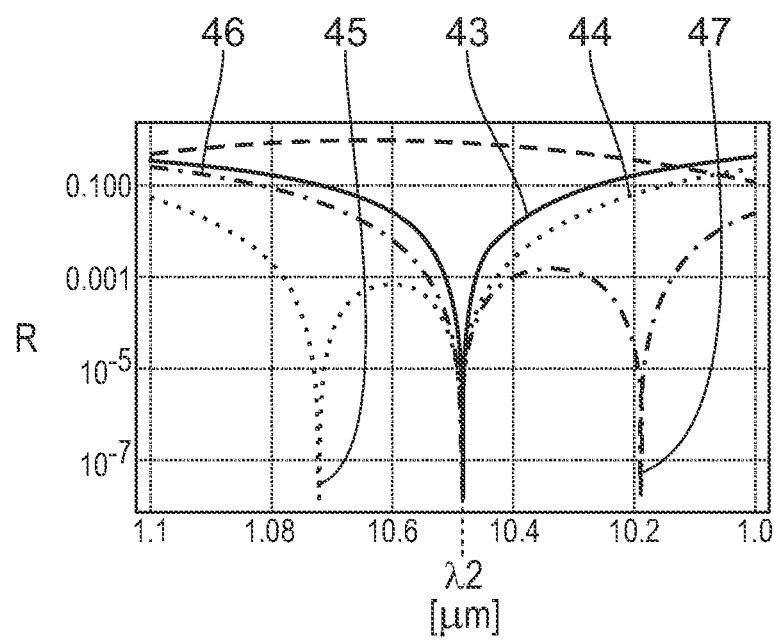
FIG. 11 shows, in an illustration similar to FIG. 10, the wavelength-dependent reflectivity of the optical diffraction components according to FIGS. 6/7, 8 and 9 in comparison with the optical diffraction component not according to the disclosure in the region of the second target wavelength.

FIGS. 10 and 11 show the suppression performance of the optical diffraction components 39 to 42 once again in comparison with an optical grating not according to the disclosure with three diffraction structure levels, which is designed for suppressing exactly one target wavelength, namely the wavelength λ1 at 10.6 μm.

FIG. 10 shows the reflectivity R in the wavelength range of between 10 μm and 11 μm and FIG. 11 shows the reflectivity in the wavelength range between 1.0 μm and 1.1 μm.

The two designs, which lead to the optical diffraction components 39, 40 according to FIGS. 6 and 7, produce the same suppression effect, illustrated as reflectivity 43 in FIGS. 10 and 11. A suppression that is better than $10^{-7}$ results both at the target wavelength λ1 (FIG. 10) and at the target wavelength λ2 (FIG. 11).

A reflectivity 44 of the optical diffraction component 41 has a similarly good suppression effect at the two target wavelengths, wherein an additional suppression in the region of 1.07 μm (side minimum 45) takes place in the case of this design of the optical diffraction component 41.

The optical diffraction component 42 also has a suppression in the region of the two target wavelengths λ1, λ2 which is comparable to that of the optical diffraction component 39, 40 (reflectivity 46), wherein a further side minimum 47 of the suppression is additionally present at a wavelength of approximately 1.02 μm.

The suppression in the region of the target wavelengths λ1, λ2 has a somewhat broader bandwidth in the case of the optical diffraction components 41, 42 in comparison with the optical diffraction components 39, 40.

The above-explained structurings of the optical gratings can have the effect that stray light radiation having an infrared wavelength, for example, that is reflected by the EUV collector 24 interferes destructively in a zero order and a stray light intensity is thus suppressed in the zero order. In this case, the optical diffraction components described above are generally used as reflective components.

A main body of the EUV collector 24 can be manufactured from aluminum. Alternative materials for this main body are copper, alloys including the constituent copper and/or aluminum or alloys, produced by powder metallurgy, of copper and aluminum oxide or silicon.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An optical diffraction component, comprising:
a periodic grating structure profile comprising diffraction structures,
wherein:
each diffraction structure has exactly a first diffraction structure level, a second diffraction structure level and a third diffraction structure level;
the first diffraction structure level is equal to a reference plane;
the second diffraction structure level is above the reference plane;
the third diffraction structure level is below the reference plane;
the first, second and third diffraction structure levels define a topography of a grating period of the grating structure profile;
the grating period repeats regularly along a period running direction;
along the period running direction, the first diffraction structure level extends less than 50% of the grating period;
the diffraction structures are configured so that, during use of the optical diffraction component, a wavelength range around two different target wavelengths diffracted by the periodic grating structure profile comprises radiation components with three different phases that interfere destructively with one another;
a difference between the two different target wavelengths is less than 50%; and
the two target wavelengths differ by at least 1%.

2. The optical diffraction component of claim 1, wherein the second and third diffraction structure levels extend an equal distance along the period running direction.

3. The optical diffraction component of claim 1, wherein a height of the second diffraction structure level above the reference plane is equal to a depth of the third diffraction structure level below the reference plane.

4. The optical diffraction component of claim 1, wherein the two target wavelengths differ by at least 10%.

5. The optical diffraction component of claim 1, wherein the grating period extends between 0.5 mm and 5 mm along the period running direction.

6. The optical diffraction component of claim 1, wherein the diffraction structure levels have a mirror-symmetrical arrangement.

7. The optical diffraction component of claim 1, wherein the second and third diffraction structure levels extend an equal distance along the period running direction, and a height of the second diffraction structure level above the reference plane is equal to a depth of the third diffraction structure level below the reference plane.

8. The optical diffraction component of claim 1, wherein the second and third diffraction structure levels s extend an equal distance along the period running direction, and the grating period extends between 0.5 mm and 5 mm along the period running direction.

9. The optical diffraction component of claim 1, wherein the second and third diffraction structure levels extend an equal distance along the period running direction, and the diffraction structures have a mirror-symmetrical arrangement.

10. A collector mirror, comprising:
an optical component according to claim 1,
wherein the collector mirror is an EUV collector mirror.

11. The collector mirror of claim 10, wherein:
the collector mirror is configured to guide EUV radiation toward a focal region; and
the optical diffraction component is configured to guide radiation at at least one of two different target wavelengths away from the focal region.

12. An illumination system, comprising:
an EUV collector comprising an optical component according to claim 1; and
an illumination optical unit,
wherein the EUV collector is configured to provide EUV radiation to the illumination optical unit, and the illumination optical unit is configured to illuminate an object with the EUV radiation.

13. An optical system, comprising:
an EUV collector comprising an optical component according to claim 1;
an illumination optical unit; and
a projection optical unit,
wherein the EUV collector is configured to provide EUV radiation to the illumination optical unit, the illumination optical unit is configured to illuminate an object field with the EUV radiation, and the projection optical unit is configured to image the object field into an image field.

14. An apparatus comprising:
an EUV light source;
an EUV collector comprising an optical component according to claim 1;
an illumination optical unit; and
a projection optical unit,
wherein the EUV light source is configured to provide EUV radiation to the EUV collector, the EUV collector is configured to provide the EUV radiation to the illumination optical unit, the illumination optical unit is configured to illuminate an object field with the EUV radiation, and the projection optical unit is configured to image the object field into an image field.

15. A method of using an apparatus comprising an EUV collector, an illumination optical unit and a projection optical unit, the method comprising:
using the EUV collector to provide EUV illumination to the illumination optical unit;
using the illumination optical unit to illuminate a reticle in an object field with the EUV radiation; and
using the projection optical unit to image the reticle into a light-sensitive material in an image field,
wherein the EUV collector comprises an optical component according to claim 1.

16. The optical diffraction component of claim 1, wherein, along the period running direction, the first diffraction structure level extends at least 5% of the grating period.

17. The optical diffraction component of claim 1, wherein, along the period running direction, the first diffraction level extends:
less than 49.95% of the grating period; and
at least 5% of the grating period.

18. The optical diffraction component of claim 1, wherein, along the period running direction, the first diffraction level extends:
less than 49% of the grating period; and
at least 5% of the grating period.

19. The optical diffraction component of claim 1, wherein, along the period running direction, the first diffraction level extends:
less than 45% of the grating period; and
at least 5% of the grating period.

20. The optical diffraction component of claim 1, wherein, along the period running direction, the first diffraction level extends:
less than 40% of the grating period; and
at least 5% of the grating period.

* * * * *

UNITED STATES PATENT AND TRADEMARK OFFICE
CERTIFICATE OF CORRECTION

PATENT NO. : 11,947,265 B2
APPLICATION NO. : 17/673966
DATED : April 2, 2024
INVENTOR(S) : Heiko Feldmann It is certified that error appears in the above-identified patent and that said Letters Patent is hereby corrected as shown below:

In the Specification

Column 8, Line 45, delete "No" and insert -- $N_0$ --.

Column 8, Line 48, delete "No" and insert -- $N_0$ --.

Column 8, Line 67, delete "No" and insert -- $N_0$ --.

Column 9, Line 23, delete "No" and insert -- $N_0$ --.

Column 10, Line 59, delete "No" and insert -- $N_0$ --.

In the Claims

Column 12, Line 56, Claim 8, delete "levels s" and insert -- levels --.

Signed and Sealed this
Fourth Day of June, 2024

Katherine Kelly Vidal
*Director of the United States Patent and Trademark Office*